United States Patent [19]

Dewitt

[11] Patent Number: 4,556,804
[45] Date of Patent: Dec. 3, 1985

[54] POWER MULTIPLEXER SWITCH AND METHOD

[75] Inventor: B. Chris Dewitt, Austin, Tex.
[73] Assignee: Motorola, Inc., Schaumburg, Ill.
[21] Appl. No.: 552,933
[22] Filed: Nov. 17, 1983
[51] Int. Cl.[4] .......................................... H03K 17/693
[52] U.S. Cl. .............................. 307/296 R; 307/200 B; 307/355; 307/571; 307/584; 307/585
[58] Field of Search .................... 307/200 B, 451, 351, 307/355, 549-550, 571-572, 577, 579, 584-585, 296 R, 304; 361/90-92; 365/226

[56] References Cited

U.S. PATENT DOCUMENTS

| | | | |
|---|---|---|---|
| 3,936,676 | 2/1976 | Fujita | 307/296 R X |
| 4,099,073 | 7/1978 | Hashimoto et al. | 307/296 R |
| 4,295,176 | 10/1981 | Wittwer | 361/91 |
| 4,321,489 | 3/1982 | Higuchi et al. | 365/226 X |
| 4,384,350 | 5/1983 | Lee et al. | 307/200 B X |
| 4,463,270 | 7/1984 | Gordon | 307/200 B X |
| 4,473,758 | 9/1984 | Huntington | 307/296 R |
| 4,499,388 | 2/1985 | Adam | 307/451 X |
| 4,513,212 | 4/1985 | Money | 307/571 X |

Primary Examiner—Stanley D. Miller
Assistant Examiner—D. R. Hudspeth
Attorney, Agent, or Firm—Anthony J. Sarli, Jr.; Jeffrey Van Myers

[57] ABSTRACT

A power multiplexer switch for alternatively coupling a supply or standby voltage line to an output voltage line comprises a first switching means for coupling an intermediate node to a common voltage line. Second switching means are responsive to the first switching means for coupling the supply voltage line to the output voltage line. Third and fourth series switching means connected to the intermediate node couple the standby voltage line to the output voltage line when a voltage on the standby voltage line exceeds that on the supply voltage line.

12 Claims, 2 Drawing Figures

POWER MULTIPLEXER SWITCH AND METHOD

BACKGROUND OF THE INVENTION

The present invention relates, in general, to the field of power multiplexer switches and methods. More particularly, the present invention relates to a circuit and method for alternatively coupling a supply voltage line ($V_{DD}$) or a standby voltage line ($V_{STB}$) to an output voltage line ($V_{OUT}$) of especial utility in supplying standby power to a microcomputer (MCU) random access memory (RAM).

In some MCU applications, it is desirable that operation of the device be in either a normal or standby mode. In the former instance, a source of $V_{DD}$ of approximately 5 volts is applied to the MCU including its on-chip RAM. In the latter instance, when the supply voltage is switched off, that is brought to a potential of 0 volts ($V_{SS}$), it would then be necessary that standby power be immediately applied in order to ensure the integrity of the RAM's data.

Heretofore, there have been no readily effectuated means for supplying a source of standby power to an integrated circuit such as an MCU RAM, such devices therefore, required either a constant source of $V_{DD}$ or to have its on-chip RAM reprogrammed upon power up. A system for providing RAM retention during power up and power down is described in U.S. Pat. No. 4,145,761 issued to Gunter et al. and assigned to the assignee of the present invention.

SUMMARY OF THE INVENTION

It is therefore an object of the present invention to provide an improved power multiplexer switch and method.

It is further an object of the present invention to provide an improved power multiplexer switch and method which will provide a source of standby power to an integrated circuit such as an MCU RAM.

It is still further an object of the present invention to provide an improved power multiplexer switch and method which will provide a source of standby power to an integrated circuit such as an MCU RAM immediately upon switching off its source of supply voltage.

It is still further an object of the present invention to provide an improved power multiplexer switch and method which is readily integratable with an integrated circuit such as an MCU utilizing a minimum number of components and on-chip area.

The foregoing and other objects are achieved in the present invention wherein there is provided a power multiplexer switch and method for alternatively coupling a supply or standby voltage line to an output voltage line comprising first switching means for coupling an intermediate node to a common voltage line. Second switching means are responsive to the first switching means for coupling the supply voltage line to the output voltage line. Third and fourth switching means connected to the intermediate node couple the standby voltage line to the output voltage line when a voltage on the standby voltage line exceeds that on the supply voltage line.

BRIEF DESCRIPTION OF THE DRAWINGS

The above-mentioned and other features and objects of the present invention and the manner of attaining them will become more apparent and the invention itself will be best understood by reference to the following description of an embodiment of the invention taken in conjunction with the accompanying drawings, wherein.

DESCRIPTION OF A PREFERRED EMBODIMENT

Figure 1:
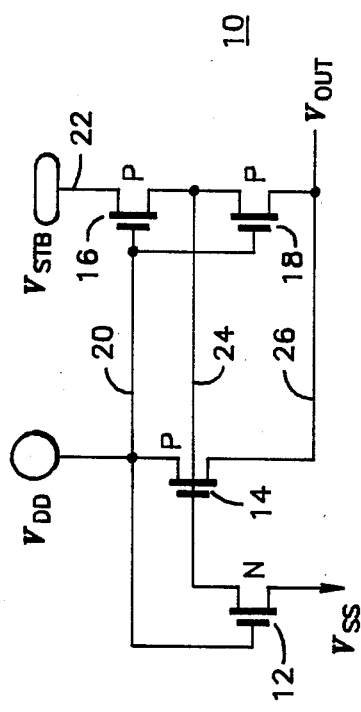
FIG. 1 is a simplified schematic diagram of a readily integratable power multiplexer switch in accordance with the present invention.

With reference to FIG. 1, a power multiplexer switch 10 in accordance with the present invention is shown. Power multiplexer switch comprises, in pertinent part, switching devices for alternatively coupling $V_{DD}$ line 20 or $V_{STB}$ line 22 to $V_{OUT}$ line 26.

N-channel transistor 12 has its source terminal connected to a common voltage line $V_{SS}$. The gate terminal of N-channel transistor 12 is connected to $V_{DD}$ line 20. The drain terminal of N-channel transistor 12 defines a node 24. P-channel transistor 14 has its source terminal connected to $V_{DD}$ line 20 and its drain terminal connected to $V_{OUT}$ line 26. The gate terminal of P-channel transistor 14 is connected to node 24.

Series connected P-channel transistors 16,18 couple $V_{STB}$ line 22 to $V_{OUT}$ line 26. P-channel transistor 16 has its source terminal connected to $V_{STB}$ line 22 and its drain terminal connected to the source terminal of P-channel transistor 18, which in turn, has its drain terminal connected to $V_{OUT}$ line 26. The respective gate terminals of P-channel transistors 16,18 are connected to $V_{DD}$ line 20. The drain terminal of P-channel transistor 16 and the source terminal of P-channel transistor 18 are connected to node 24.

Power multiplexer switch 10 allows for power to be applied to circuits that will be used in a normal or standby mode. In the "normal" operating mode, the circuitry would operate off the source of $V_{DD}$. When the $V_{DD}$ supply switches off, that is to $V_{SS}$, the standby power supply is automatically switched in before the voltage on $V_{DD}$ line 20 drops from 5.0 volts to approximately 3.5–4.0 volts or approximately one P-channel threshold below $V_{STB}$. Therefore, the voltage appearing on $V_{OUT}$ line 26 never drops below approximately 3.25 volts. In an integrated version of power multiplexer switch 10, when a source of $V_{DD}$ is supplied to the entire chip, the state of $V_{STB}$ line 22 is irrelevant as long as it does not go below $V_{SS}$ which might cause a latchup condition by pulling current out of the integrated circuit substrate.

$V_{DD}$ is supplied.

When the voltage on $V_{DD}$ line 20 is high, N-channel transistor 12 is on which pulls the gate of P-channel transistor 14 to $V_{SS}$, turning it on and thereby powering the standby circuits connected to $V_{OUT}$ line 26 with $V_{DD}$. Since the voltage on $V_{DD}$ line 20 is high, P-channel transistors 16,18 are turned off, thereby isolating $V_{STB}$ line 22 from the circuits powered at $V_{OUT}$ line 26.

$V_{STB}$ is supplied.

When going into the standby mode of operation, the voltage on $V_{DD}$ line 20 goes low turning N-channel transistor 12 off and, in turn, turning P-channel transistors 16,18 on. As P-channel transistors 16,18 turn on, current from the standby voltage applied to $V_{STB}$ line 22 and $V_{OUT}$ line 26 charge the gate of P-channel transistor 14 turning it off. P-channel transistors 16,18 then turn on hard and supply current for the circuits on standby connected to V_{OUT} line 26.

Figure 2:
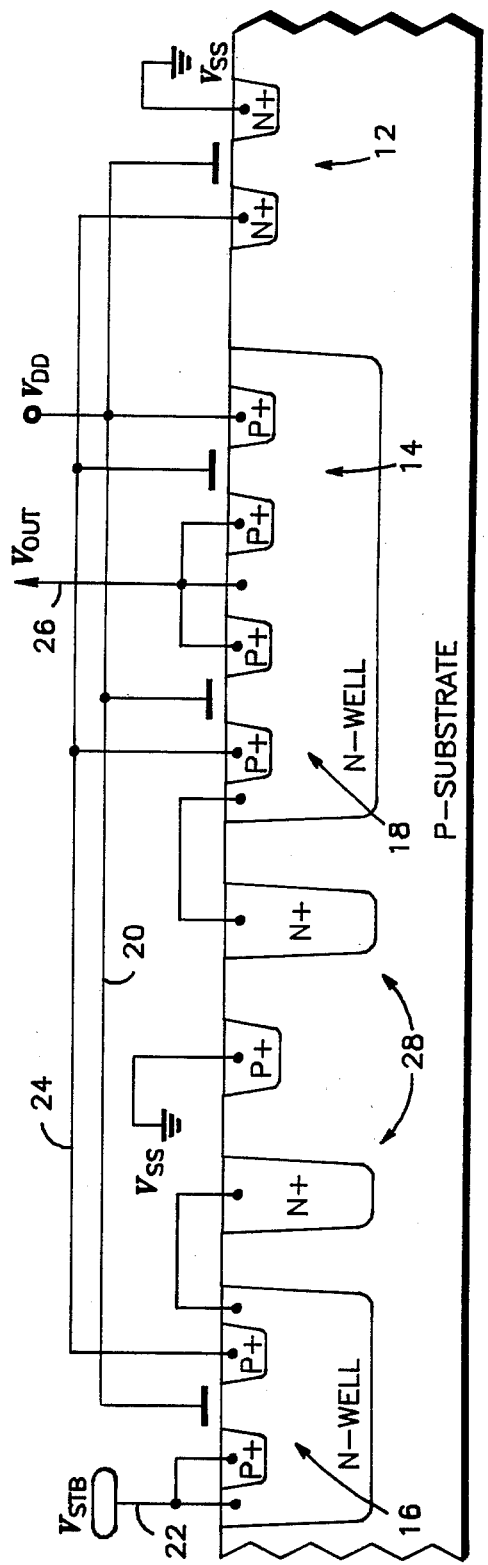
FIG. 2 is a simplified cross-sectional view of an integrated version of the power multiplexer switch of FIG. 1.

Referring additionally now to FIG. 2, like structure to that above-described with respect to FIG. 1 is like numbered and the foregoing description thereof shall suffice as a description herefor. It can be seen that P-channel transistors 14,18 are built in a common N-well within a P-substrate powered by the voltage appearing on $V_{OUT}$ line 26. Utilizing this arrangement, the N-well for the P-channel devices that supply power for standby circuits will always be powered. An N+ guard ring 28 for this well is also powered from the voltage on $V_{OUT}$ line 26. As is shown, the N-well for P-channel transistor 16 is powered from the voltage on $V_{STB}$ line 22.

In the embodiment above described, P-channel transistors 14,16 and 18 are P-channel devices having width-/length ratio of about 500/3. N-channel transistor 12 is an N-channel enhancement devices having a width-/length ratio of about 8/40.

What has been provided, therefore, is an improved power multiplexer switch and method which may be used to provide a source of standby power to a portion of an integrated circuit such as an MCU RAM. By use of the switch and method of the present invention, a source of standby power to a portion of an integrated circuit such as an MCU RAM will be immediately applied upon switching off its source of supply voltage. The power multiplexer switch of the present invention may be readily integrated with an integrated circuit such as an MCU utilizing a minimum number of components and on-chip area.

While there have been described above the principles of the invention in conjunction with specific apparatus, it is to be clearly understood that this description is made only by way of example and not as a limitation to the scope of the invention.

I claim:

1. A power multiplexer switch for alternatively coupling a supply or standby voltage line to an output voltage line comprising:
    first switching means for coupling an intermediate node to a common voltage line;
    second switching means responsive to said first switching means for coupling said supply voltage line to said output voltage line; and
    third and fourth switching means connected to said intermediate node for coupling said standby voltage line to said output voltage line when a voltage on said standby voltage line exceeds that on said supply voltage line.

2. The power multiplexer switch of claim 1 wherein said first switching means is an N-channel MOS device.

3. The power multiplexer switch of claim 1 wherein said second, third and fourth switching means are P-channel MOS devices.

4. The power multiplexer switch of claim 1 wherein said supply voltage line is connected to a source of approximately 5.0 volts.

5. A method for alternatively coupling a supply or standby voltage line to an output voltage line comprising the steps of:
    providing a first switching device coupling an intermediate node to common voltage line,
    firstly coupling said supply voltage line to said output voltage line by means of a second switching device in response to said first switching device; and
    secondly coupling said standby voltage line to said output voltage line by means of third and fourth switching devices connected to said intermediate node in response to a voltage on said standby voltage line exceeding that on said supply voltage line.

6. The method of claim 5 wherein said step of providing is carried out by means of an N-channel MOS device.

7. The method of claim 5 wherein said step of firstly coupling is carried out by means of a P-channel MOS device being enabled in response to said first switching device being enabled.

8. The method of claim 5 wherein said step of secondly coupling is carried out by means of a pair of P-channel MOS devices being enabled in response to a voltage on said standby voltage line exceeding that on said supply voltage line.

9. A power multiplexer switch for alternatively coupling a supply or standby voltage line to an output voltage line comprising:
    a first switching device having first source, drain and gate terminals thereof, said first gate terminal being connected to said supply voltage line, said first source terminal being connected to a common voltage line and said first drain terminal thereof defining a voltage node;
    a second switching device having second source, drain and gate terminals thereof, said second source terminal thereof being connected to said supply voltage line, said second drain terminal thereof being connected to an output voltage line and said second gate terminal thereof being connected to said voltage node; and
    third and fourth series connected switching devices having respective third and fourth source, drain and gate terminals thereof, said third source terminal being connected to said standby voltage line, said fourth drain terminal being connected to said output voltage line, said third and fourth gate terminals being connected to said supply voltage line and said third drain and fourth source terminals being connected to said voltage node.

10. The power multiplexer switch of claim 9 wherein said first switching device is an N-channel MOS device.

11. The power multiplexer switch of claim 9 wherein said second, third and fourth switching devices are P-channel MOS devices.

12. The power multiplexer switch of claim 9 wherein said supply and standby voltage lines are connected to a source of approximately 5.0 volts.

* * * * *